United States Patent [19]

Liu et al.

[11] Patent Number: 4,882,200
[45] Date of Patent: Nov. 21, 1989

[54] METHOD FOR PHOTOPATTERNING METALLIZATION VIA UV-LASER ABLATION OF THE ACTIVATOR

[75] Inventors: Yung S. Liu, Scotia; Willard T. Grubb, Schenectady, both of N.Y.

[73] Assignee: General Electric Company, Schenectady, N.Y.

[21] Appl. No.: 237,638

[22] Filed: Aug. 23, 1988

Related U.S. Application Data

[63] Continuation of Ser. No. 52,295, May 21, 1987, abandoned.

[51] Int. Cl.$^4$ .................... B05D 3/06; B05D 5/12; B05D 3/04; B44C 1/22
[52] U.S. Cl. .................... 427/53.1; 427/54.1; 427/98; 427/306; 156/632
[58] Field of Search ............ 427/53.1, 54.1, 98, 427/306; 156/632, 643, 654

[56] References Cited

U.S. PATENT DOCUMENTS

| | | | |
|---|---|---|---|
| 3,791,340 | 2/1974 | Ferrara | 427/54.1 |
| 3,950,570 | 4/1976 | Kenney | 427/306 |
| 3,954,570 | 5/1976 | Shirk et al. | 204/15 |
| 4,078,096 | 3/1978 | Redmond et al. | 427/98 |
| 4,112,139 | 9/1978 | Shirk et al. | 427/54 |
| 4,414,059 | 11/1983 | Blum et al. | 427/54.1 |
| 4,417,948 | 11/1983 | Mayne-Banton et al. | 427/54.1 |
| 4,440,801 | 4/1984 | Aviram et al. | 427/306 |
| 4,508,749 | 4/1985 | Brannon et al. | 427/54.1 |
| 4,617,085 | 10/1986 | Cole et al. | 427/53.1 |
| 4,684,437 | 8/1987 | Donelon et al. | 156/643 |
| 4,686,114 | 8/1987 | Halliwell et al. | 427/53.1 |
| 4,780,177 | 10/1988 | Wojnarowski et al. | 427/53.1 |

OTHER PUBLICATIONS

"Webster's 3$^{rd}$ New International Dictionary", unabridged, Ed. Grove G & C. Merrian Co., Publishers, Springfield, Mass., USA 1961, p. 4.

Primary Examiner—Sam Silverberg
Assistant Examiner—Marianne L. Padgett
Attorney, Agent, or Firm—Robert Ochis; James C. Davis, Jr.; Marvin Snyder

[57] ABSTRACT

A laser, such as an excimer laser, is employed to ablate electroless plating activator material from polymer and other substrates. The treated substrates are then immersed in electroless plating baths for plating of conductive material over remaining activator material. The method is particularly effective for depositing conductive patterns on non-flat substrates and on substrates needing plated-through connections. High resolution patterns are created on any compatible polymer substrate with any compatible electroless plating activator material.

34 Claims, 3 Drawing Sheets

METHOD FOR PHOTOPATTERNING METALLIZATION VIA UV-LASER ABLATION OF THE ACTIVATOR

This application is a Continuation of application Ser. No. 052,295, filed May 21, 1987 now abandoned.

Background of the Invention

The present invention is generally related to methods for patterning conductive patterns on polymer and other substrates. More particularly, the present invention is directed to a method for selectively removing electroless plating activator material from polymer and other substrates by laser means so as to ultimately provide high resolution metal patterns on polymer substrates, especially substrates possessing plated through apertures and three dimensional contours.

Methods for patterning conductive metals on insulative surfaces of plastics, ceramics or other nonconductive substrates are desired for many electronic applications such as the fabrication of printed circuit boards. Methods for patterned metallization are particularly desirable for use in conjunction with new thermoplastic materials such as ULTEM TM polyetherimide material resin.

Photo-induced area selective metal patterning is a known method for electroless metal deposition on nonconductors. (See "Photoselective Metal Deposition" by D. J. Sharp, Plating, August 1971, page 786.) Photopatterning typically involves pretreatment of a substrate with a reducible or oxidizable metallic salt solution, such as stannous chloride, followed by patterned (selective) exposure of the sensitized substrate with ultraviolet (UV) light. Typically, this process involves photochemical reactions in which desensitization of catalytic metallic nuclei takes place, and as a result, auto-catalysis in electroless plating processes are inhibited. Possible mechanisms of photochemical processes involve photoinduced electrochemical reactions, photo-electron generation and photo-induced oxidation/reduction via intra-molecular charge transfer. Examples of the use of such processes are described in U.S. Pat. No. 4,112,129 issued to Shirk et al. and in U.S. Pat. No. 4,096,043 issued to DeAngelo.

Existing photo-chemical metal patterning methods are typically performed using an incoherent ultraviolet lamp and with the radiation source typically operating at wavelengths of less than approximately 400 nm. Because of the low radiation intensity available from the incoherent source and the divergence of the light source used, resolution is limited to several tens of microns. Furthermore, because of the incoherent lamp sources employed, more complicated optical systems are required for fabricating circuit boards having a non-planar geometry. A new photo-chemical method which circumvents these difficulties is therefore desired. These difficulties include long exposure time, limited resolution and non-applicability to three dimensional printed circuit board fabrication.

The production of polymeric materials which are moldable and which exhibit properties permitting soldering of electronic components to metal patterns disposed on the polymeric materials has led to the desire to construct electronic articles of manufacture in which devices such as integrated circuit chips are mounted on three dimensional circuit boards. These three dimensional circuit boards may actually form an integral part of the device being manufactured. Thus, the printed circuit board concept is extended so that the board is no longer a mere electrical circuit component, but also serves as a mechanical component of a device. This naturally involves the formation of printed circuit boards which exhibit a plurality of flat areas lying at non-zero angles with respect to one another. Conventional photo-induced metal patterning is difficult for three dimensional circuit boards because of the incoherent nature of the light source.

Another problem that exists in circuit board fabrication is the problem of plated-through via holes that extend from one side of the board to the other. As a result of this requirement, it is generally desired that a negative (in the photographic sense) form of patterning be employed. That is to say, the presence of via openings in a substrate generally dictates that patterning methods be employed which remove or prevent deposition of conductive material in locations other than the via openings (in which it has previously been deposited). This is a consequence of the fact that it is hard to pattern conductive materials disposed in via openings which are too narrow for this purpose.

One of the significant aspects of the present invention is the use of laser ablation to pattern electroless metal plating activator materials. Certainly, laser methods have been employed for ablating a number of different materials in various industrial applications. Examples of this are provided in U.S. Pat. No. 4,617,085 issued to Cole et al., which is hereby incorporated herein by reference. It is noted, however, that this patent is not related to metal patterning. However, in any given application considered, it has not been known a priori whether or not laser ablation methods would be effective to achieve the results desired. There are many variables that must be considered in laser ablation practice. For example, different materials which are to be ablated exhibit different optical properties of transmittance and reflectance of laser light at different frequencies. Furthermore, it is not known a priori whether or not certain materials will be resistant to laser ablation methods. In particular, it is not known beforehand whether or not the level of laser energy which must be supplied for purposes of ablation is so strong that underlying materials would also be damaged to the point of non-utility. This is particularly true when the underlying substrate comprises polymeric materials. With particular attention to the problem of electroless plating, it was also not known beforehand whether or not laser energy applied to activator materials would operate to damage the polymeric substrate in such a way that subsequent patterning would be ineffective. In short, without having actually tried, it would not be known beforehand whether or not laser energy directed at a polymeric substrate coated with an activator material would operate to pattern the material for selective deposition of conductive patterns. It is possible that the laser energy might have effected a combination of the polymer and the activator and failed to produce a pattern of desensitized areas which are not prone to receipt of electroless plating materials.

Summary of the Invention

In accordance with a preferred embodiment of the present invention, a method for patterning electroless plating activator materials disposed on a rigid polymer substrate comprises the step of selectively exposing the activator material on the substrate to a laser beam sufficiently powerful to locally ablate the activator material. In accordance with another embodiment of the invention, a method for forming conductive patterns on a polymer substrate comprises the steps of coating the substrate with an electroless plating activator. This activator material is selectively exposed to a laser beam of sufficient power to locally ablate the activator material. The exposed substrate is then immersed in an electroless plating bath for a time sufficient to deposit conductive material such as copper on the remaining activator material.

In accordance with preferred embodiments of the present invention, the polymer substrate comprises material such as ULTEM ™ polyetherimide material resin, epoxy or aromatic polymers. The laser employed is preferably an excimer laser employing ArF, XeCl, KrF or XeF. The laser may either be a pulsed laser or a continuous laser. In preferred embodiments of the present invention, the activator includes precious metal materials such as palladium and/or palladium complexes or other precious metals and/or their complexes. The laser energy is preferably directed at the substrate at a fluence level sufficient to completely remove substantially all of the activator material applied. The laser is directed against the activator coated substrate by either contact or projection methods. For example, a fluence level of approximately 20 millijoules/cm$^2$ is found to be sufficient when using a XeF laser operating at a frequency of 248 nm for use in treating an ULTEM ™ polyetherimide resin substrate for electroless copper patterning.

Accordingly, it is an object of the present invention to provide a selective electroless plating process which is compatible with other electroless plating process steps.

It is also an object of the present invention to reliably produce plated through-hole metallization patterns on polymer substrates.

It is a further object of the present invention to provide a method in which the processing time for metal patterning is comparable to or shorter than the time required for other processing steps in the plating cycle.

It is a still further object of the present invention to provide a method for metal patterning on moldable, solderable thermoplastic materials such as ULTEM ™ polyetherimide material resin.

It is also an object of the present invention to provide a metal patterning process which is applicable to nonplanar surfaces.

It is yet an other object of the present invention to provide a metal plating process which is low in cost and yet can serve the needs of high volume production situations.

It is also an object of the present invention to provide a metal patterning method for which ambient conditions are not critical and which can in fact be carried out atmospherically.

Lastly, but not limited hereto, it is an object of the present invention to provide a metal plating process exhibiting high resolution characteristics.

Description of the Figures

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

Detailed Description of the Invention

Figure 1:
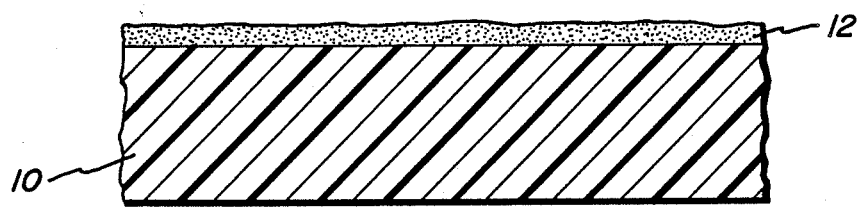
FIG. 1 is a cross-sectional side elevation view illustrating a process step in accordance with the present invention in which activator material is disposed on a polymer substrate.
Figure 2:
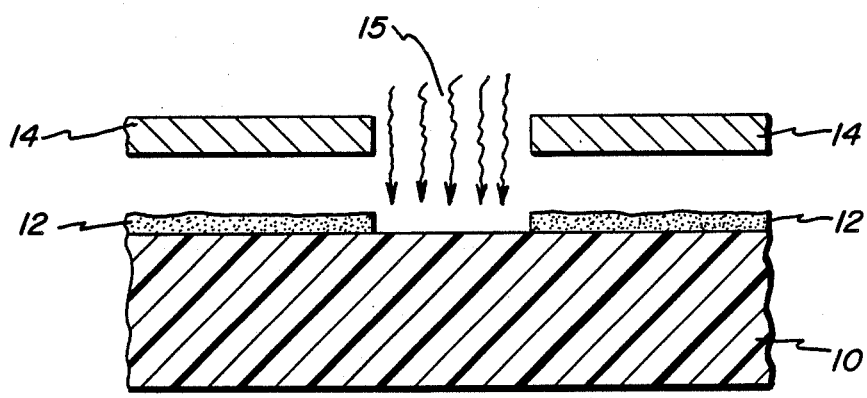
FIG. 2 is a cross-sectional side elevation view similar to FIG. 1 more particularly illustrating exposure of the activator material to laser light through a noncontact mask.
Figure 3:
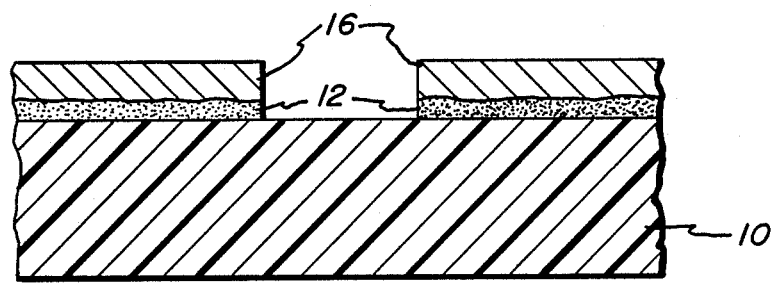
FIG. 3 is a cross-sectional side elevation view more particularly illustrating the result of immersing the exposed substrate from FIG. 2 in an electroless plating bath to achieve selective deposition of conductive material on the substrate.

FIGS. 1-3 illustrate process steps carried out in furtherance of the present invention. In particular, FIG. 1 illustrates the application of electroless plating activator material 12 applied to the surface of polymer substrate 10. A preferable polymeric material is ULTEM ™ polyetherimide material resin. It is noted that activator materials are also referred to in the electroless plating arts as sensitizers or plating catalysts. As is also well known, electroless plating refers to plating operations occurring in a chemical bath and which do not require the application of electrical energy through the bath. For the practice of the present invention, substrate 10 is preferably coated with a sensitizing agent such as palladium, palladium complexes or other types of plating catalysts.

In accordance with of the present invention, the coated substrate is selectively exposed to laser beam radiation of sufficient power to locally ablate the activated material. This process is illustrated in FIG. 2. In particular, laser radiation 15 is seen being applied to substrate 10 and activator 12 through an aperture in mask 14. However, it is noted that it is not necessary to employ a mask for the practice of the present invention.

Instead, it is possible, in situations where it is desirable, to employ lasers which are focused and driven, as by mirror reflection, to perform the selective ablation. Contact or projection methods may also be employed for achieving the selective exposure. FIG. 2 also illustrates that laser radiation 15 acts to selectively ablate activator material 12 which has been exposed through mask 14. In the preferred practice of the present invention, an excimer laser is employed which exhibits a fluence of at least approximately 20 millijoules per $cm^2$. The laser may be operated in either a pulsed or continuous fashion to effectively remove the catalyzing (activation) agent 12 on the surface and to thus desensitize the surface area exposed to radiation.

A metal image is then produced on the exposed substrate when it is dipped into an electroless plating solution such as an electroless copper bath. Such baths would include solutions such as ENPLATE 406 (from the Enthone Corp. of West Haven, Connecticut). A metal film 16 (preferably copper) in FIG. 3 having a thickness of approximately 0.1 to 0.2 microns, is deposited in a few minutes. Since desensitization of the polymeric substrate occurs on the surface, typically within a thickness of a few monolayers, high resolution images have been achieved and demonstrated.

The term additive bath is also generally applied to electroless plating. The baths are generally, however, limited in the thickness of material such as copper, which may be deposited. The electroless plating process itself typically occurs over a period of hours, if "thick" layers are desired. For example, is not uncommon for the deposition of 1 mil thick copper to take 20 hours.

Electroplating steps may also be performed after carrying out process steps in accordance with the present inventions, primarily for the purpose of adding arbitrarily thick conductive patterns. However, in electroplating, each isolated conductive path would have to be treated individually. When done, a jig for this purpose is used.

It is also generally desirable that material ablated from the substrate not fall back onto the surface. This problem can, for example, be ameliorated by ablation processes carried out in a gas stream which removes ablation debris from the area of the substrate. Other means for preventing re-deposition of the activator may also be employed. These include using a coating over the activator prior to ablation. The coating is thereafter removed. Photoresist or other removable materials may be employed as such debris protective coatings.

EXAMPLE I

Copper has been selectively deposited on a substrate comprising ULTEM ™ polyetherimide resin using activator patterning with an excimer laser operating at an output frequency of 193 nm. An area of activator material was exposed to excimer irradiation using a metal contact mask. This area was subsequently inhibited from copper plating. A study of the irradiation sensitivity showed that a single 15 nanosecond pulse from an ArF excimer laser operating at 193 nm effectively desensitized the ULTEM ™ polyetherimide resin surface at a radiation fluence level above 20 millijoules per $cm^2$ in an ambient atmospheric environment. At this sensitivity level, a 100 centimeter square substrate can be patterned in one second using an excimer laser producing 0.15 joules per pulse operated at 20 pulses per second with a beam size of 2.5 centimeters by 0.5 centimeters. Suitable excimer lasers are commercially available such as Lambda Physik Model 150 (manufactured by Lambda Physik, a subsidiary of Coherent, Inc. of Sunnyvale, Calif.

EXAMPLE II

Samples of ULTEM ™ polyetherimide resin were pretreated with sulfuric acid for a surface roughening so as to improve its adhesion properties. Experiments were carried out to determine the effects of surface roughness on the irradiation conditions required for selective patterning. These results are summarized in the following table.

TABLE 1

|  | 248 nm (KrF) | 351 nm (XeF) |
| --- | --- | --- |
| Fluence level | 300 mJ/$cm^2$ | 230 mJ/$cm^2$ |
| Pulses employed | 100 pulses | 50 pulses |
| Absorption depth | 0.04 microns | 1 microns |
| Etch depth at 300 mJ/$cm^2$ | 0.11 microns | 0.12 microns |

All samples were selectively electroless plated after excimer radiation. It is noted that the etch depths at the fluence level of 300 millijoules per $cm^2$, are comparable for 248 nm and 351 nm wavelength radiation in spite of a large difference in the absorption depth at these wavelengths. The absorption coefficient of ULTEM ™ polyetherimide resin at 308 nm is $3.5 \times 10^4$ per cm. This may be compared with an absorption coefficient of ULTEM ™ polyetherimide resin of $2.5 \times 10^5$ per cm at 248 nm and $1.0 \times 10^4$ per cm at 351 nm. It is noted that 308 nm is a desired wavelength for the application of patterning palladium activator material on an ULTEM ™ polyetherimide resin substrate whose surface has been severely roughened to improve adhesion properties.

EXAMPLE III

An ULTEM ™ polyetherimide resin polymeric board was first sensitized using commercially available Shipley Cataprep 404 and Cataposit 44 solutions, then placed on a computer controlled XY positioning stage. The board was then exposed to a KrF excimer laser operating at a wavelength of 248 nm at a fluence level of approximately 50 millijoules per pulse and at a pulse rate of 10 pulses per second. Exposure was accomplished through a flat quartz mask placed on top of the board separated from the surface by a few millimeters. The laser had a beam size of 10 millimeters in diameter and was used without a focusing lens. After exposure, the substrate was electroless plated with copper in ENPLATE ™ 406 solution. The pulse energy required to desensitize the surface was found to be approximately 50 millijoules per $cm^2$. The processing time required for laser patterning can be less than one second per board by using an excimer laser operated at a power level of 0.30 joules per pulse at a rate of 10 pulses per second with a beam size of 10 mm × 60 mm.

EXAMPLE IV

Samples of Pyralin ™ (a polyimide resin manufactured by the DuPont du Nemours Company) were spin-coated on glass substrates and were prepared and sensitized using the process described in Example III above. The samples were exposed through a quartz mask to excimer laser pulses at 248 nm or 193 nm. They were then immersed in an electroless copper bath and patterns were formed. The fluence required for this particular example was about 20 to 30 millijoules/cm².

The substrates employed herein may also comprise layered structures. These include laminates and in particular, thin film polymer materials disposed on an inorganic substrate such as glass, metal or ceramics. Other usable polymers include polycarbonates, polymethylmethacrylate (PMMA), polystyrenes, silicon polyimides and blends of aromatic polymers such as polyimides and polyetherimides. Usable substrates also include non-conductive materials such as ceramics.

Additional experiments have been carried out to compare copper patterns which are deposited via a process using an incoherent ultraviolet lamp with the copper deposited using the laser method of the present invention. In the comparison, a copper line was deposited on a polymer surface by electroless plating by means of patterning using an incoherent ultraviolet lamp which photo-oxidized the surface and thus desensitized it. When compared with copper lines deposited in accordance with the present invention, edge definition was found to be significantly improved with the laser method.

Figure 4A:
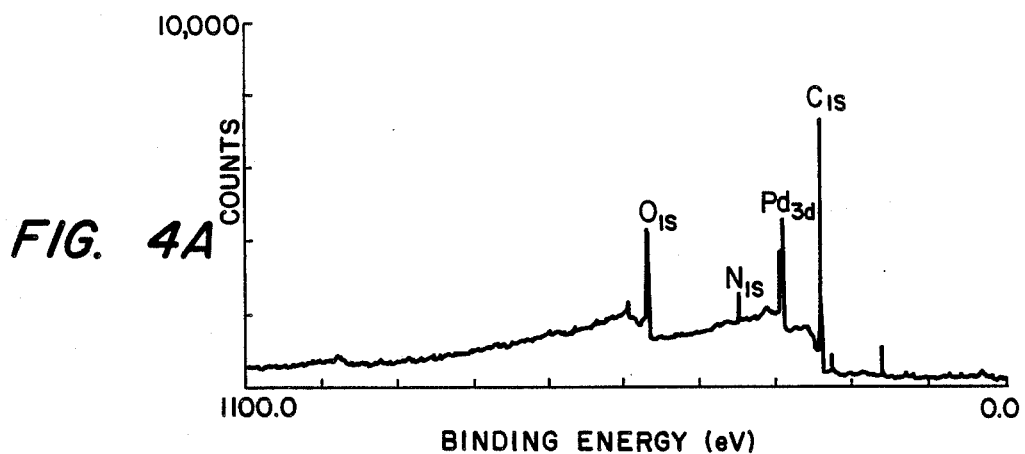
FIG. 4A is a graph illustrating the results of an x-ray photoluminescent spectroscopy analysis of a palladium activator material disposed on an ULTEM ™ polyetherimide resin substrate in an area which has not been irradiated by laser treatment.
Figure 4B:
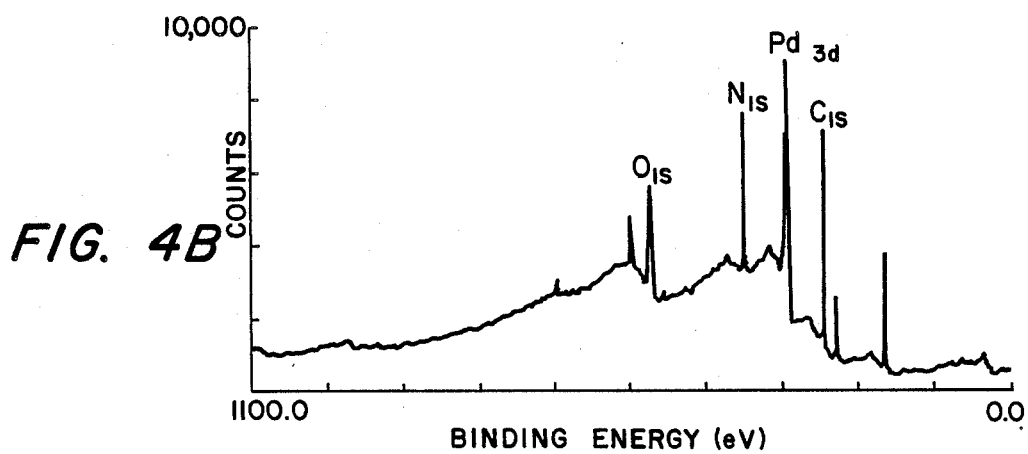
FIG. 4B is a graph similar to FIG. 4A illustrating the effect of a single ArF laser pulse at an insufficient fluence level to remove palladium on the substrate.

X-ray photoluminescent spectroscopy studies were also undertaken to determine and illustrate the effects of exposure to laser radiation upon the sensitizing agents. A summary of these studies is indicated in the graphs of FIGS. 4 and 5. In particular, FIG. 4A provides a graph illustrating a control spectrum produced by x-ray photoluminescent spectroscopic analysis of a palladium activator material disposed on an ULTEM ™ polyetherimide material resin substrate in an area which has not been irradiated by laser radiation. In particular, the presence of the 3d palladium line is noted. Other peaks indicating the presence of carbon, oxygen and nitrogen are also labeled. It is noted for comparison that the vertical scale in FIGS. 4 and 5 is not necessarily the same for each of the graphs presented.

Figure 4C:
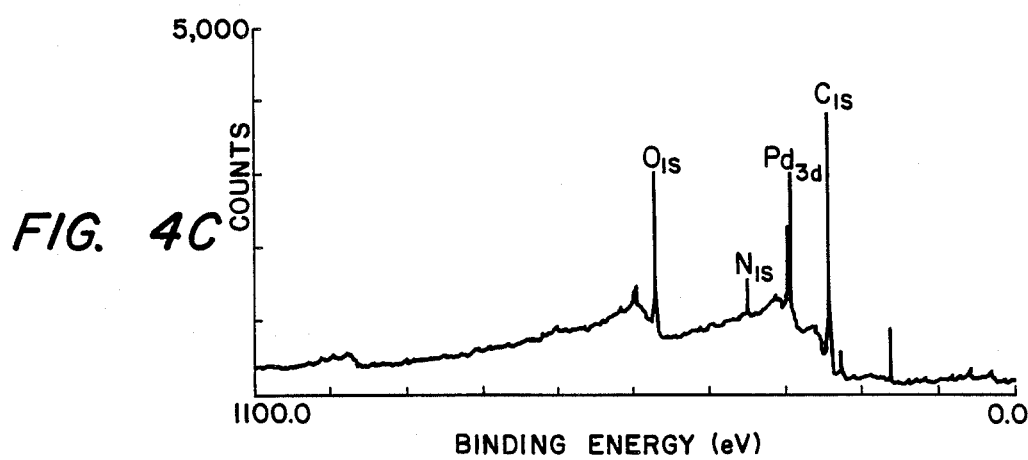
FIG. 4C is a graph similar to FIG. 4B illustrating the effect that at this low fluence level, even after ten pulses, palladium activator material remains on the substrate.
Figure 5A:
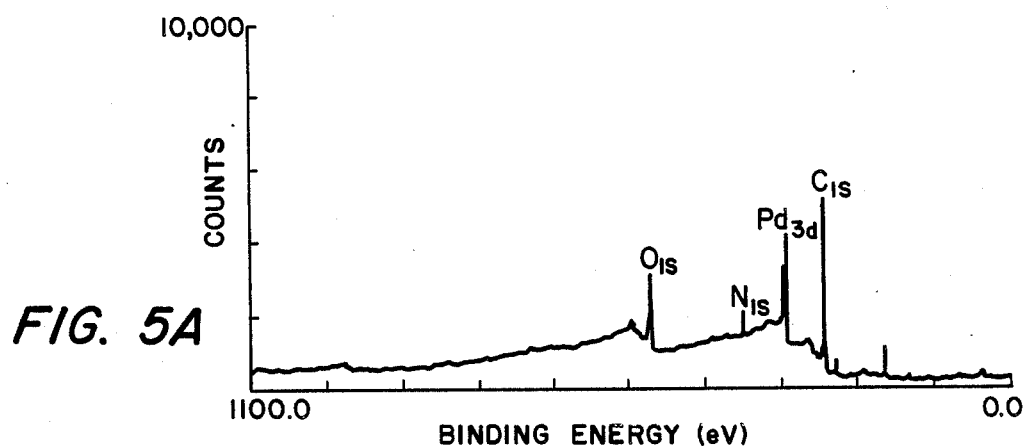
FIG. 5A is a graph illustrating the results of an x-ray photoluminescent spectroscopy analysis of a palladium activator material disposed on an ULTEM ™ polyetherimide resin substrate in an area which has not been irradiated by laser radiation (as in FIG. 4A)
Figure 5B:
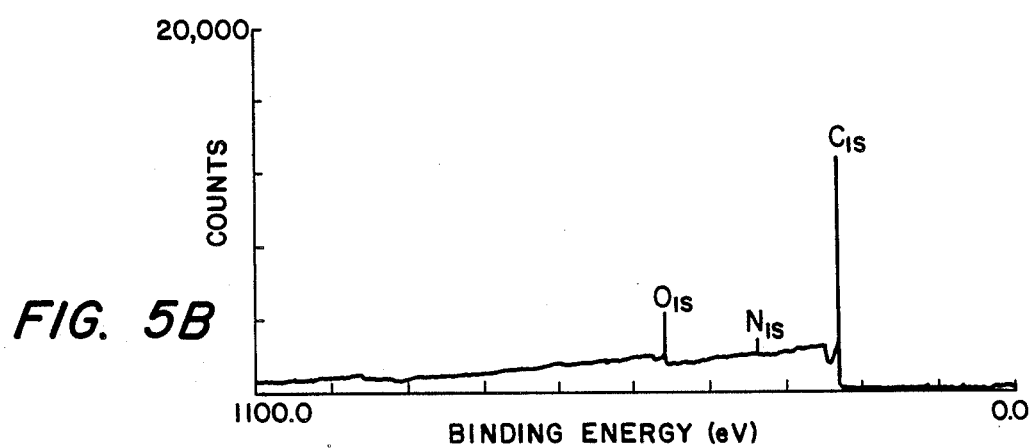
FIG. 5B is an x-ray photoluminescent spectroscopy graph illustrating the fact that a 40 millijoule per cm$^2$ pulse from a 193 nanometer excimer laser is sufficient to remove palladium activator material from a substrate of ULTEM ™ polyetherimide resin.
Figure 5C:
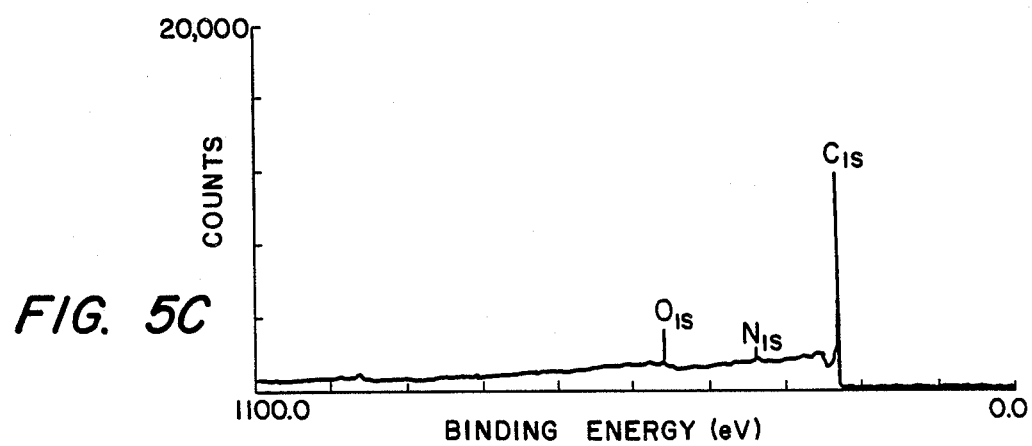
FIG. 5C is a graph similar to FIG. 5A more particularly illustrating the results obtained with two pulses of the same excimer laser and also illustrating the fact that the x-ray photoluminescence spectrum obtained is identical to that obtained from a native (i.e, untreated ULTEM ™ polyetherimide resin surface.

FIGS. 4A and 4C indicates the effects on palladium activator removal when the substrate is irradiated at a fluence below about 10 millijoules per cm². The graph of FIG. 4B illustrates the spectral result when only one pulse is applied. If 10 pulses are applied at this low fluence level, palladium is still seen to be present, as illustrated in FIG. 4C. However, when an ULTEM ™ polyetherimide material resin substrate with the organopalladium complex is irradiated at a fluence level of 40 millijoules per cm² for one pulse using an excimer laser operating for one pulse at a wavelength of 193 nm, it is seen (in FIG. 5B) that palladium is absent. The same result holds if two pulses are applied, as is illustrated in FIG. 5C. The substrates treated at a low irradiating fluence, as illustrated in the results from FIGS. 4B and 4C, failed to make good, clean copper patterns using electroless plating.

Thus, under the circumstances shown in FIGS. 4B and 4C, metal patterning fails to be produced when the substrate is immersed in an electroless plating bath. Also, under the conditions shown in FIGS. 5B and 5C, metal patterns are produced when the irradiated substrate is immersed in an electroless plating bath; and the irradiated areas do not contain metal deposition.

From the above, it should be appreciated that the process of the present invention provides an effective mechanism for the formation of conductive patterns, especially copper, on polymeric substrates. It is further seen that the method of the present invention is applicable to substrates with apertures and also to substrates which exhibit non-flat or three dimensional configurations. It is also seen that the processes of the present invention can be carried out rapidly so as to produce high resolution conductive patterns in an economical and flexible fashion.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for patterning electroless plating activator material disposed on a polymer substrate, said method comprising the step of:
    selectively exposing said polymer substrate and said electroless plating activator material disposed thereon to an ultraviolet laser beam which is sufficiently powerful to ablate said activator material.
2. The method of claim 1 wherein:
    said polymer is a polyimide.
3. The method of claim 2 wherein:
    said polyimide is a polyetherimide.
4. The method of claim 1 in which said exposure occurs through a mask.
5. The method of claim 1 in which said exposure is performed with a scanned and focused laser beam.
6. The method of claim 1 in which said laser is an excimer laser.
7. The method of claim 1 in which said laser is selected from the group consisting of ArF, KrF, XeCl and XeF lasers.
8. The method of claim 1 in which said laser is a pulsed laser.
9. The method of claim 8 in which said pulse duration is approximately 15 nanoseconds.
10. The method of claim 1 in which said laser is a continuous laser.
11. The method of claim 1 in which said laser is operated to produce a fluence level of at least approximately 20 millijoules per square centimeter.
12. The method of claim 1 in which said activator material is selected from the group consisting of palladium, palladium complexes and precious metal activators.
13. The method of claim 1 in which said substrate is a polymer and said polymer is selected from the group consisting of epoxy polymers and aromatic polymers.
14. The method of claim 1 in which said substrate includes apertures.
15. The method of claim 1 in which said substrate exhibits at least two surfaces disposed at non-zero angles with respect to one another.
16. The method of claim 1 in which said laser is operated to produce a fluence level of at least approximately 20 millijoules per square centimeter at a power level of at least about 1 megawatt per square centimeter.
17. The method for forming conductive patterns on a polymer substrate, said method comprising the steps of:
    coating said substrate with an electroless plating activator material;
    selectively exposing said substrate and said electroless plating activator material thereon to an ultraviolet laser beam which is sufficiently powerful to ablate said activator material; and
    then immersing said substrate in an electroless plating bath for a time sufficient to deposit conductive material on the activator material which was not ablated.

18. The method of claim 17 wherein:
said polymer is a polyetherimide.

19. The method of claim 17 in which said exposure occurs through a mask.

20. The method of claim 17 in which said exposure is performed with a driven and focused laser beam.

21. The method of claim 17 in which said laser is an excimer laser.

22. The method of claim 17 in which said laser is selected from the group consisting of ArF, KrF, XeCl and XeF lasers.

23. The method of claim 17 in which said laser is a pulsed laser.

24. The method of claim 23 in which said pulse duration is approximately 15 nanoseconds.

25. The method of claim 17 in which said laser is a continuous laser.

26. The method of claim 17 in which said laser is operated to produce a fluence level of at least approximately 20 millijoules per square centimeter.

27. The method of claim 17 in which said activator is selected from the group consisting of palladium, palladium complexes and precious metal activators.

28. The method of claim 17 wherein:
said polymer is selected from the group consisting of epoxy polymers and aromatic polymers.

29. The method of claim 17 in which said substrate includes apertures.

30. The method of claim 17 in which said substrate exhibits at least two surfaces disposed at non-zero angles with respect to one another.

31. The method of claim 17 in which said laser is operated to produce a fluence level of at least approximately 20 millijoules per square centimeter at a power level of at least about 1 megawatt per square centimeter.

32. The method of claim 17 wherein:
said polymer is a polyimide.

33. The method for patterning electroless plating activator material disposed on a polymer substrate, said method comprising the steps of:
selectively exposing said polymer substrate and said electroless plating activator material thereon to an ultraviolet laser beam with a power level which is above an ablation threshold level to ablate said activator material.

34. A method of forming conductive patterns on a polymer substrate, said method comprising the steps of:
coating said substrate with an electroless plating activator material;
selectively exposing said substrate and said electroless plating activator material thereon to an ultraviolet laser beam having a power level which is above an ablation threshold to ablate said activator material; and
then immersing said substrate in an electroless plating bath for a time sufficient to deposit conductive material on the activator material which was not ablated.

* * * * *